United States Patent [19]
Hikasa et al.

[11] Patent Number: 5,859,862
[45] Date of Patent: Jan. 12, 1999

[54] OPTICAL RECORDING/REPRODUCING APPARATUS HAVING LASER DIODE DRIVER CAPABLE OF A LINEAR OPERATION RESPONSIVE TO AN INPUT SIGNAL REPRESENTATIVE OF A LASER BEAM POWER VARYING DEPENDING ON A MAGNETO-OPTICAL DISK-LASER BEAM SPOT RELATIVE SPEED

[75] Inventors: Kazuhiko Hikasa, Hamura; Tadashi Oka, Ome, both of Japan

[73] Assignee: Hitachi, Ltd., Tokyo, Japan

[21] Appl. No.: 492,617

[22] Filed: Jun. 20, 1995

[30] Foreign Application Priority Data

Jun. 28, 1994 [JP] Japan .................................. 6-169049

[51] Int. Cl.⁶ ...................................................... H01S 3/10
[52] U.S. Cl. ................................ 372/38; 372/29; 372/31
[58] Field of Search .................................... 347/247, 237; 372/38, 29, 31, 50

[56] References Cited

U.S. PATENT DOCUMENTS

| 3,504,302 | 3/1970 | Fenner | 372/50 |
| 5,097,473 | 3/1992 | Taguchi | 372/38 |
| 5,579,329 | 11/1996 | Taguchi | 372/38 |

FOREIGN PATENT DOCUMENTS

| 53-61984 | 6/1978 | Japan . | |
| 6-267101 | 9/1994 | Japan | 372/38 |

OTHER PUBLICATIONS

Nikkei Electronics, Feb. 8, 1988, No. 440, pp. 115–142.

*Primary Examiner*—Rodney B. Bovernick
*Assistant Examiner*—Yisun Song
*Attorney, Agent, or Firm*—Fay, Sharpe, Beall, Fagan, Minnich & McKee

[57] ABSTRACT

An optical recording/reproducing apparatus has a laser diode and a semiconductor integrated circuit device for driving the laser diode. The semiconductor integrated circuit device has a driver circuit for producing a drive current to be supplied to a laser diode in accordance with an input signal representative of a laser beam power varying depending on a relative speed between a magneto-optical disk and a spot of a laser beam emitted by the laser diode on the optical disk. The driver circuit has a non-linear first operation range and a substantially linear second operation range subsequent to the first operation range. For a linear operation of the driver circuit, a level shifter circuit is connected to the driver circuit for applying a shift voltage to the driver circuit with a result that an excess output current is produced by the driver circuit even when the input signal is non-existent. To prevent supply of the excess output current to the laser diode, a current suppressing circuit is provided for supplying a suppression current to the driver circuit.

7 Claims, 5 Drawing Sheets

OPTICAL RECORDING/REPRODUCING APPARATUS HAVING LASER DIODE DRIVER CAPABLE OF A LINEAR OPERATION RESPONSIVE TO AN INPUT SIGNAL REPRESENTATIVE OF A LASER BEAM POWER VARYING DEPENDING ON A MAGNETO-OPTICAL DISK-LASER BEAM SPOT RELATIVE SPEED

BACKGROUND OF THE INVENTION

The invention relates to a an optical recording/reproducing apparatus having a laser diode driver and, more particularly, to a technique effective for use in a magneto-optical recording and reproducing apparatus of a light modulating type.

With respect to a rewritable optical disk, reference may be made to "Nikkei Electronics", Nikkei McGraw-Hill, Inc., No. 440, pages 115–142, Feb. 8, 1988. In a light modulation type disk, among such rewritable optical disks, a temperature of a recording layer of the disk is raised to a temperature near a Curie temperature by heat of a laser beam and "1" and "0" are recorded (written) on a recording magnetic medium in terms of the direction of an auxiliary magnetic field. To read out data recorded on the optical disk, use is made of the Kerr effect such that when the laser beam is reflected from the disk surface, a plane of polarization is rotated and changed depending on a direction of the magnetization of the disk.

In the magneto-optical disk recording and reproducing apparatus of the light modulation type, it is necessary to raise the temperature of the recording layer of the disk to a temperature near the Curie temperature as mentioned above. Since the magneto-optical disk rotates at a constant speed, relative moving speeds of a laser beam spot on inner side tracks and outer side tracks differ. Namely, since the relative moving speed of the beam spot is high for the outer side tracks of the disk, it is necessary to enhance the laser beam power in order to raise the temperature of the recording layer to the Curie temperature. On the other hand, since the relative moving speed of the beam spot is low for the inner side tracks, it is sufficient to set a laser beam for raising the temperature of the recording layer to the Curie temperature to rather a weak power. For this purpose, it will be necessary to accurately control a drive current of the laser diode in accordance with track address information of the disk.

A technique is disclosed in JP-A-53-61984 (laid-open on Jun. 2, 1978) in which a drive current of a light emitting device is controlled by supplying a current from a second current source to a first current source for supplying a drive current to a light emitting diode.

SUMMARY OF THE INVENTION

The inventors of the present invention have found the fact that when a digital drive signal corresponding to the controlled drive current is formed from the track address information, converted to an analog voltage and supplied to the base of a transistor in the laser diode driver to form a drive current for the laser diode, non-linear distortion occurs in a laser beam amount due to the non-linearity of the transistor, with a result that, since a change amount of a collector current for a change in input voltage is small in a range of low input voltages to the transistor, a current change amount per unit voltage step is small, an area of the disk in which the temperature reaches the Curie temperature with a laser beam of the same intensity is smaller for inner side tracks in which a relatively weak laser beam is used by reducing an input voltage to the base of the transistor than for outer side tracks in which a relatively strong laser beam is used by increasing the input voltage.

In the magneto-optical recording medium, in order to obtain a plane of polarization of the reflection light necessary for the reading (reproducing) operation, a drive current is to be eventually set so as to obtain a temperature spot of a size necessary for the inner side tracks in which a relatively weak laser beam is used. Therefore, a temperature spot which is larger than it is needed is formed in the outer side tracks and an area in which the direction of the magnetization is changed increases, and it will be necessary to largely set a track interval in order to prevent occurrence of a mutual interference between tracks by such a large writing or erasing area as mentioned above. This will be an obstruction to enhancement of the recording capacity. On the other hand, if a drive current such as to obtain a temperature spot of a size necessary for the outer side tracks is set in order to realize a large memory capacity, data writing/reading would not be possible on the inner side tracks.

It is an object of the invention to provide a laser diode driver for a magneto-optical disk recording and reproducing apparatus which can realize a high density and a high reliability of the recording by a simple construction.

The above and other objects and novel features of the present invention will become apparent from the detailed description and the appended claims of the invention.

In one aspect of the present invention, an optical recording/reproducing apparatus has a laser diode and a semiconductor integrated circuit device for driving the laser diode, wherein the semiconductor integrated circuit device includes a driver circuit for producing a drive current to be supplied to a laser diode in accordance with an input signal representative of a laser beam power varying depending on a relative speed between a magneto-optical disk and a spot of a laser beam emitted by the laser diode on the optical disk. The driver circuit has a non-linear first operation range and a substantially linear second operation range subsequent to the first operation range. For a linear operation of the driver circuit, a level shifter circuit is connected to the driver circuit for applying a shift voltage to the driver circuit with a result that an excess output current is produced by the driver circuit even when the input signal is nil. For prevention of supply of the excess output current to the laser diode, a current suppressing circuit is provided for supplying a suppression current to the driver circuit.

In another aspect of the present invention, since a drive current of a substantially good linearity can be produced in accordance with an input digital signal generated from track information, the reliability of the writing/erasing operation and the recording density of the magneto-optical disk recording and reproducing apparatus can be improved.

DESCRIPTION OF THE PREFERRED EMBODIMENT

Figure 1:
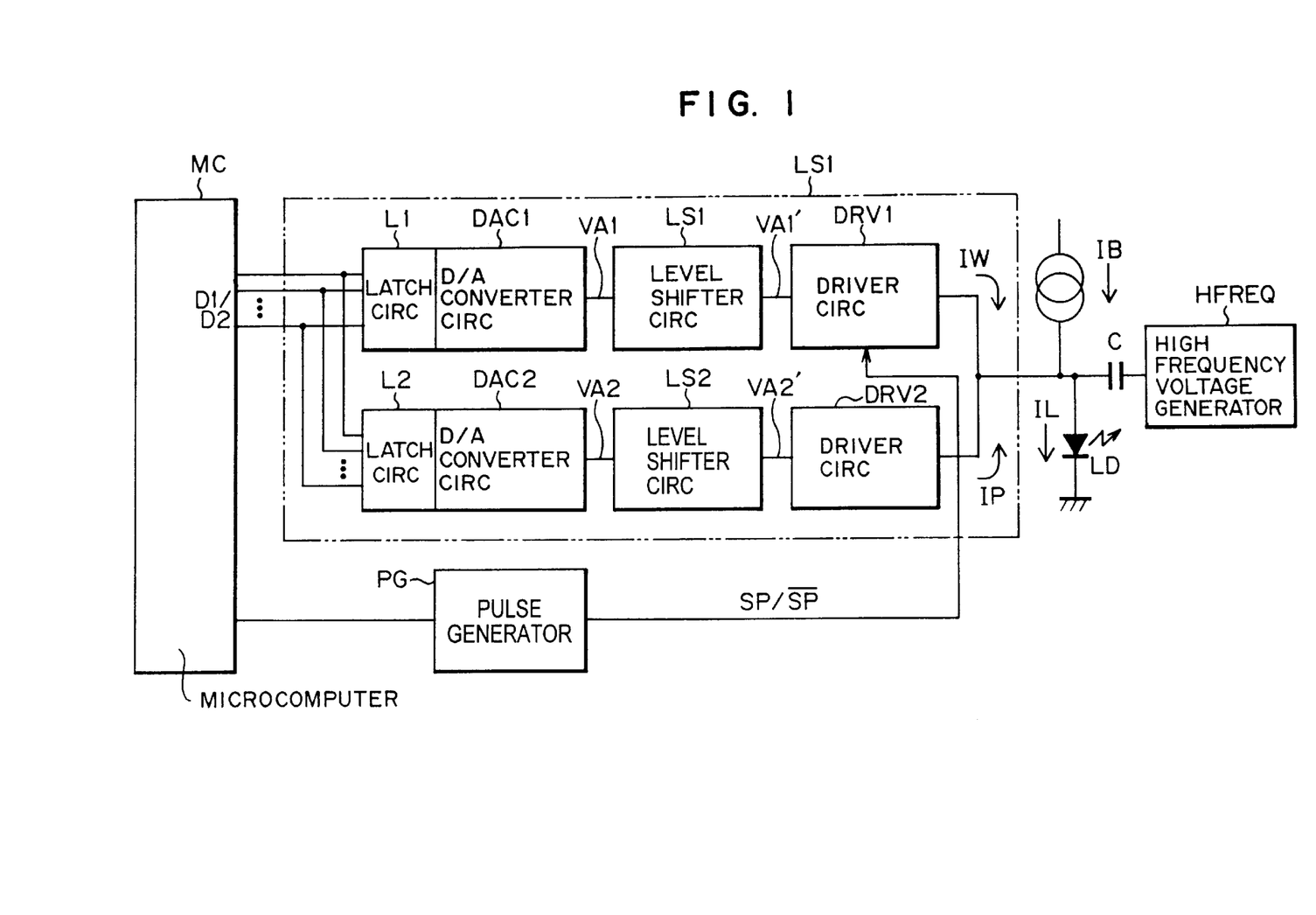
FIG. 1 is a block diagram of a laser diode driver for a magneto-optical disk recording and reproducing apparatus according to an embodiment of the invention.

FIG. 1 is a block diagram of a laser diode driver for a magneto-optical disk recording and reproducing apparatus according to an embodiment of the present invention. In the diagram, the circuit blocks surrounded by the two dot-dash lines are formed in a single semiconductor substrate such as monocrystalline silicon by a well-known manufacturing technique of a semiconductor integrated circuit.

In the embodiment, a first input digital signal D1 representative of a laser power necessary for writing or erasing which varies depending on a relative moving speed between a laser beam and a magneto-optical disk and a second input digital signal D2 representative of a laser power for a preliminarily heating of the disk for preparation of the writing or erasing are generated, for example, by a microcomputer MC. Those first and second input digital signals D1 and D2 are supplied in a time-division fashion through common input terminals to latch circuits L1 and L2 provided for input sections of first and second digital-analog converter circuits. Consequently, the number of external terminals of a semiconductor integrated circuit device can be reduced.

The first and second input digital signals D1/D2 supplied to the latch circuits L1 and L2 are converted to first and second input analog voltage signals VA1 and VA2 by first and second digital-analog converter circuits DAC1 and DAC2, respectively. If the analog voltage signals VA1 and VA2 are directly supplied to the bases of the output transistors forming the drive currents as mentioned above, areas in which the direction of the magnetization is reversed by a writing or erasing operation will differ in the inner side areas and outer side areas of the disk because of the non-linearity of the voltage-current characteristics of the output transistor. If an intensity of the laser beam suitable for inner side areas of the disk is used as a reference, the reversed magnetization area in outer side areas of the disk will be excessively increased to degrade the recording density. On the contrary, if an intensity of the laser beam suitable for the outer side areas is used as a reference, the reversed magnetization area in the inner side areas will be excessively decreased and is insufficient for reading.

In this embodiment, the analog voltage signals VA1 and VA2 are level-shifted by first and second level shifter circuits LS1 and LS2. Namely, the analog voltage signals VA1 and VA2 are converted to voltage signals VA1' and VA2' which are level-shifted by voltage ΔV. The level-shifted voltage signals VA1' and VA2' are applied to the bases of the output transistors in driver circuits DRV1 and DRV2, so that operation points are moved to ranges in which the voltage-current characteristics of the output transistors have substantially a good linearity.

When the analog voltage signals VA1 and VA2 are level-shifted by the voltage ΔV as mentioned above, output currents IW and IP to which excess currents corresponding to the voltage ΔV have been added are produced, with a result that the drive currents from the driver circuits DRV1 and DRV2 do not correspond to the first and second input digital signals D1 and D2. To cope with this, a suppression current source circuit for supplying a current to suppress the excess current component corresponding to the voltage ΔV is provided for each of the driver circuits DRV1 and DRV2. Although currents corresponding to the level shift voltage ΔV may be generated in the driver circuits DRV1 and DRV2 even when the first and second input digital signals D1 and D2 are nil, since the suppression constant currents corresponding to the voltage ΔV are supplied to the driver circuits DRV1 and DRV2, the excess currents corresponding to the level shift voltage ΔV is prevented from being included in the drive currents IW and IP to be supplied to the laser diode LD. Consequently, the drive currents IW and IP can be set to the currents of the values corresponding to the input digital signals D1 and D2.

Since the drive currents IW and IP to be supplied to the laser diode LD are produced from the input digital signals D1 and D2, using the ranges in which the voltage-current characteristics of the output transistors have good linearity, the laser diode drive current suitable for the relative moving speed accurately determined based on a rotational speed of the disk and the position (radius) of the track selected can be obtained.

The above two output drive currents IW and IP are added and the sum current is outputted from a common output terminal OUT and is supplied to the laser diode LD. A bias current IB is supplied to the laser diode LD, too. The output current from the driver and the bias current IB are added and the sum current is supplied as an operation current IL to the laser diode LD.

A high frequency voltage generator HFREQ may be a well-known circuit for improving writing (erasing) characteristics. A high frequency voltage of a low amplitude of, for example, about 250 MHz or more is supplied via a coupling capacitance C from the high frequency voltage generator HFREQ. Although not particularly limited, the laser diode LD is installed as a module integrated with the high frequency voltage generator HFREQ. In order to suppress an increase in temperature due to heat generated by the laser diode LD, a cathode side serving as one end of the laser diode LD may be connected to a casing. The casing is connected to the ground and is used as a radiation plate.

Figure 2:
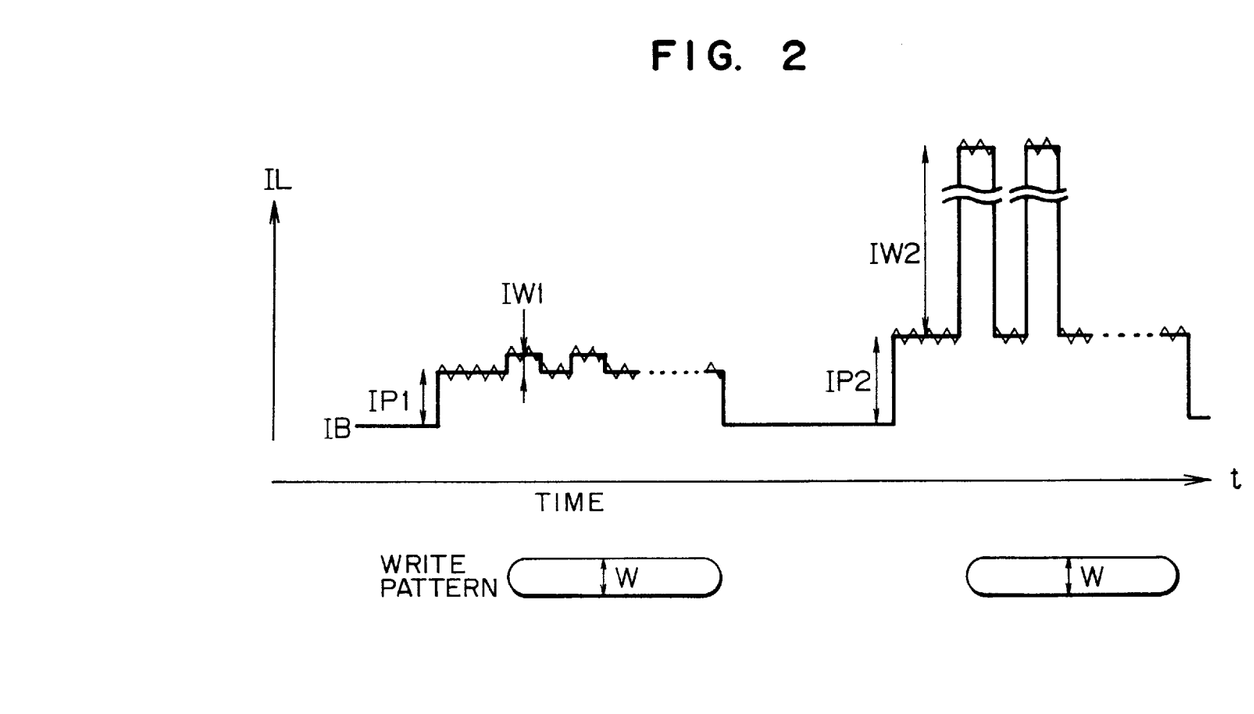
FIG. 2 is a waveform diagram for explaining the writing (erasing) operation of the laser diode driver according to the embodiment of the invention.

FIG. 2 is a waveform diagram for explaining a writing (erasing) operation of the laser diode driver for a magneto-optical disk recording and reproducing apparatus (hereinafter, simply referred to as a magneto-optical disk apparatus) according to the invention. An axis of ordinate indicates the operation current IL and an axis of abscissa shows time t. Prior to writing, for inner side tracks in which the relative moving speed between the laser beam spot and the disk is low, the bias current IB and a current IP1 (second drive current portion) for giving a laser power necessary for preliminarily heating the disk for preparation for the writing are supplied. Namely, although an output beam of the laser is preliminarily radiated onto a recording layer of the disk, the laser power is not high enough to reach the Curie temperature necessary to invert the direction of the magnetization of the recording layer of the disk. A write current IW1 (first drive current portion) is then added to the sum current (IB+IP1) to increase the laser power, so that the temperature of the recording layer is raised to a temperature near the Curie temperature, and the direction of the magnetization of the recording magnetic medium is reversed, for example, from "0" to "1" as a direction of an auxiliary magnetic field (not shown). For erasing, substantially the same operation as that mentioned above may be performed except that the direction of the magnetization is merely reversed as compared with the direction for writing. In this instance, the laser power changes in correspondence to a high frequency signal that is supplied from the high frequency voltage generator HFREQ to the laser diode LD and the temperature of the recording layer can be efficiently raised.

In the outer side tracks in which the relative moving speed is high, the bias current IB as mentioned above and a current IP2 (second drive current portion) to give the laser power necessary to preliminarily heat the disk for preparation for the writing which is larger than current IP1 in correspondence to the above relative moving speed are supplied to the laser diode LD. A write current IW2 (first drive current portion) is then added to the sum current (IB+IP2) to increase the laser power, so that the temperature of the recording layer is increased to a temperature near the Curie temperature, and the direction of the magnetization of the recording magnetic medium is reversed, for example, from "0" to "1" in correspondence to the direction of the auxiliary magnetic field (not shown). In this instance as well, the high frequency signal is supplied from the generator HFREQ to the laser diode LD.

In order to generate a reversed magnetization pattern or "write pattern" having almost the same width W on the track as shown in FIG. 2, the write currents (first drive current portions) IW1 and IW2 are set to a group of a plurality of pulse signals with smaller widths. Namely, if the write currents IW1 and IW2 are continuously supplied for a time duration corresponding to the write pattern, the width W of pattern will not be uniform but will be widened as its position is more distant from the left edge (start end of the laser beam irradiation) in FIG. 2. If the write pattern width W is not uniform or gradually increases, it will be necessary to widen the track interval to avoid interference between adjacent tracks, causing a recording density to be reduced. By utilizing the pulsating current as mentioned above, an increase of the width W of the write pattern is suppressed toward the direction opposite to the rotating direction and the width can be kept almost constant.

Figure 3:
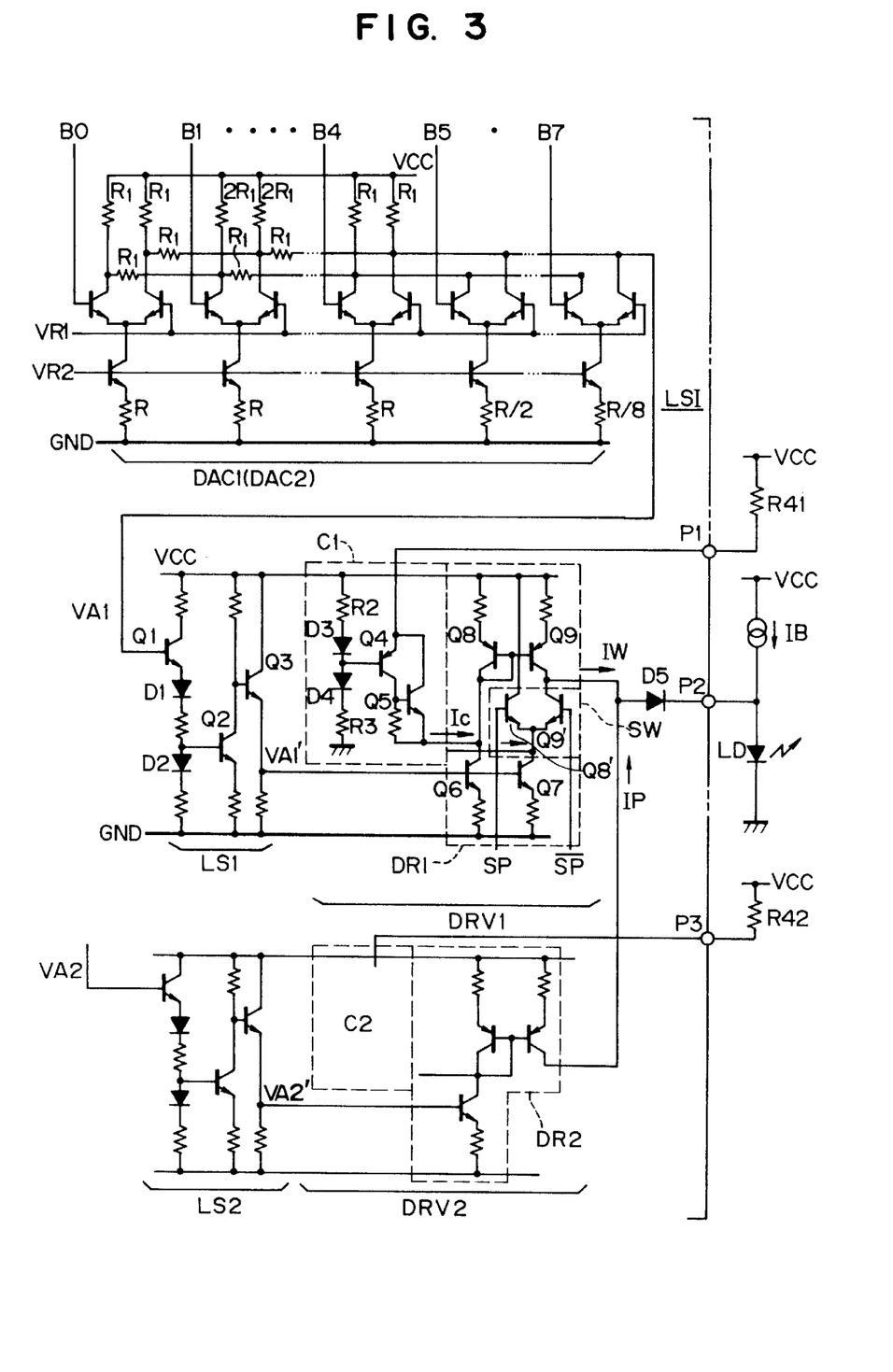
FIG. 3 is a circuit diagram of a major part of the laser diode driver of the embodiment shown in FIG. 1.

FIG. 3 is a circuit diagram of an embodiment of the laser diode driver for the magneto-optical disk apparatus according to the invention. In the embodiment including two sets of circuits for producing the drive current portions IW and IP as mentioned above, the D/A converter circuit DAC1, level shift circuits LS1 and LS2, and drivers DRV1 and DRV2 are representatively shown as an example. The D/A converter circuit DAC2 can be formed so as to have substantially the same construction as the D/A converter circuit DAC1.

The eight bit input digital signal B0 to B7 fetched from the latch circuits (not shown) is supplied to the base of one of the two differential transistors in each of eight pairs of differential transistors. A reference voltage VR1 to judge whether bits B0 to B7 of the input digital signal are at the high level or the low level is commonly supplied to the bases of the other differential transistors of the eight pairs of differential transistors.

The same constant current is supplied to the common emitter of the differential transistors corresponding to the lower five bits B0 to B4 of the eight bit input digital signal from a constant current transistor which receives a constant voltage VR2. An R-2R ladder resistor circuit is provided for collectors of those differential transistors and convert the digital signal portions of the five bits to analog voltages.

The upper three bits B5 to B7 of the input digital signal are supplied to differential transistors similar to those mentioned above. Since an R/2 resistor is provided for a common emitter of the differential transistor corresponding to bit B5, a constant current that is twice as large as the current flowing in the common emitter of the differential transistors corresponding to bits B0 to B4 is allowed to flow. An R/4 resistor is provided for a common emitter of the differential transistor corresponding to bit B6 of the digital signal (not shown), so that a constant current that is four times as large as the current flowing in the common emitter of the differential transistors corresponding to bits B0 to B4 is allowed to flow. An R/8 resistor is provided for a common emitter of the differential transistor corresponding to bit B7 of the digital signal, so that a constant current that is eight times as large as the above current is allowed to flow. By weighting the constant currents in correspondence to bits B5 to B7 of the digital signal as mentioned above, the digital-analog converting operations of eight bits can be performed by a simple construction.

The input analog voltage signal VA1 produced by the D/A converter circuit DAC1 is level-shifted by the level shifter circuit LS1 including transistors Q1 to Q3, resistors, diodes, and the like. The analog voltage signal VA1 is divided by the emitter-follower transistor Q1 and the diodes D1 and D2 and resistors provided for an emitter of the transistor Q1. The divided voltage is supplied to the base of the transistor Q2. A collector output of the transistor Q2 is outputted through the emitter-follower transistor Q3. Owing to the voltage division ratio of the voltage VA1 mentioned above, the amplifying operation by the transistor Q2, and the supplying operation of the level-shifted voltage signal VA1' by the emitter-follower transistor Q3, the output transistors Q6 and Q7 of the driver circuit DRV1 which performs the voltage-current converting operation are level-shifted so as to operate in a substantially linear range.

Figure 6:
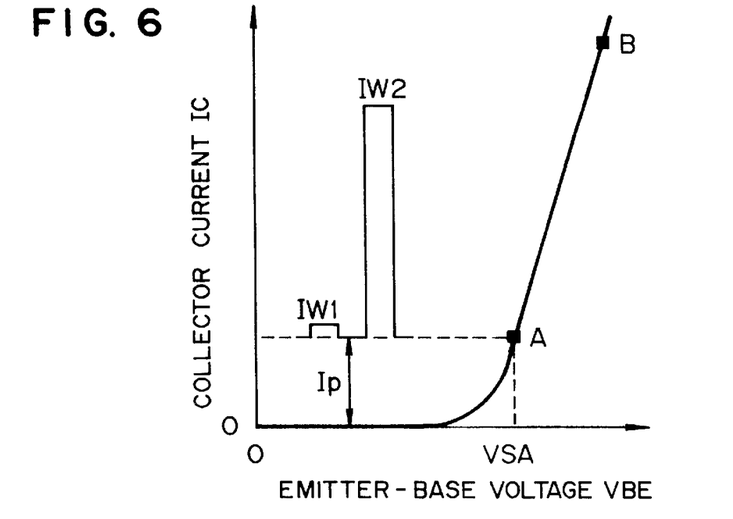
FIG. 6 is a diagram showing an example of operating characteristics of an output transistor forming a drive current output section of a driver circuit in an embodiment of the invention.

Although not particularly limited, when all of the bits B0 to B7 of the input digital signal are set to the low level, namely, when the input digital signal is nil, the level-shifted voltage signal VA1' is set to about 0.9 V. Namely, the transistors operate in an operation range with a good linearity, namely, in a substantially linear operation range in the voltage-current characteristics of the collector current IC for a base-emitter voltage VBE of the output transistors Q6 and Q7 as shown in FIG. 6. By using such an operation range, the first drive current portions IW1 and IW2 can be set to currents with a good linearity corresponding to the input digital signal D1 (D2). Although not limited, a base-emitter voltage VSA of the transistors Q6 and Q7 corresponding to the operation point A is set to about 0.9 V as mentioned above. When such a voltage VSA is applied to the bases of the transistors Q6 and Q7, even when all of the bits B0 to B7 of the input digital signal are at the low level, an excess current Ip corresponding to it flows.

A current suppressing section C1 is further provided for the driver circuit DRV1. The current suppressing section C1 produces constant current Ic of the same intensity as that of the current Ip corresponding to the voltage VSA and supplies to the collector of the transistor Q6. The current suppressing section C1 further includes a circuit arrangement such as to supply a similar current Ic to the collector of the output transistor Q7. Namely, the current suppressing section C1 divides a power source voltage VCC by diodes D3 and D4 and resistors R2 and R3 and supplies a divided voltage to a base of the PNP transistor Q4. The emitter of a transistor Q4 is connected to an external terminal P1. A resistor R41 for current adjustment is provided outside the chip LSI. The suppression current Ic generated by the transistor Q4 is outputted through an NPN transistor Q5.

It is possible that the analog voltage VA1' which was level-shifted by the level shifter circuit LS1 fluctuates depending on variations of the manufacturing processes of elements forming the circuit LS1. Similarly, the output transistors Q6 and Q7 may also be subjected to variations of the manufacturing processes. Therefore, the resistor R41 for adjustment is connected through the external terminal so as to absorb all of the variations in manufacturing processes. Namely, in a state in which all of the bits B0 to B7 of the input digital signals are set to the low level, a resistance value of the resistor R41 is selected so that a current at an output terminal P2 is nil. By such an external resistor R41, processing variations of the level shifter circuit and output transistors Q6 and Q7 as mentioned above can be compensated.

In this embodiment, in order to pulsate the write current IW (first drive current portion) as mentioned above, the output current produced by the transistor Q6 is delivered through a current mirror circuit formed by PNP transistors Q8 and Q9. A collector of one differential transistor Q9' of the NPN type is connected to a collector of the transistor Q9 on the output side. A collector of another differential transistor Q8' is connected to the power source voltage VCC. A collector of the output transistor Q7 is connected to a common emitter of the differential transistors Q8' and Q9'.

Gate pulse signals SP and $\overline{SP}$ are supplied from the microcomputer MC (FIG. 1) to the bases of the differential transistors Q8' and Q9'. When the pulse signal SP is at the high level and the pulse signal $\overline{SP}$ is at the low level, the output current produced by the output transistor Q7 flows to the power source voltage VCC. Therefore, a collector current of the output transistor Q6 is outputted as a write current IW through the current mirror circuit. When the pulse signal SP is at the low level and the pulse signal $\overline{SP}$ is at the high level, the output current produced by the output transistor Q7 flows so as to absorb a current that is outputted from the output transistor Q9 of the current mirror circuit. Therefore, the write current IW is not outputted. Since the write current IW is gated by the gate pulse signals SP and $\overline{SP}$, it becomes a pulsating current having a group of current pulses. Thus, the output transistors Q6 and Q7 and current mirror circuit of Q8 and Q9 can form a drive current output section DR1. The differential transistors Q8' and Q9' can form a switching section SW.

The D/A converter circuit DAC2 for producing the second drive current portion IP, level shifter circuit LS2, and the current suppressing section C2 of the driver circuit DRV2 have substantially the same structure as those of the circuits DAC1, LS1, and C1 in the diagram. However, since the driver circuit DRV2 to produce the current portion IP need not be converted to a switching (pulse) current like the write current IW, the transistor Q7 and the differential transistors Q8' and Q9' provided for the collector of the transistor Q7 in the diagram are omitted from the current suppressing section C2, and the driver circuit DRV2 includes the output transistor Q6 and the current mirror circuit of transistors Q8 and Q9 provided for the collector of the transistor Q6. A resistor R42 for adjustment similar to the resistor R41 for adjustment connected to the current suppressing section C1 is connected to the current suppressing section C2 through an external terminal P3.

The currents IW and IP are synthesized at the output terminal P2 and the resulting current is outputted from the external terminal P2 through a diode D5 for prevention of a reverse current. The laser diode LD to which the bias current IB is supplied from the bias current source as mentioned above is connected at the output terminal P2. In the diagram, the foregoing high frequency voltage generator is omitted for simplicity sake.

In the current suppressing section C1, the resistor R41 for adjusting the suppression current Ic may also be formed in the semiconductor integrated circuit device LSI. However, a trimming resistive element should be used to compensate the processing variations of the elements as mentioned above. For example, it is also possible to use a structure such that a plurality of kinds of resistance values can be set and a resistor is adjusted by a laser trimming or a structure such that the resistance value is adjusted by selectively cutting off fuses. In this case, fuses which are cut out by a current or those which are cut out by a laser beam irradiation may be used.

Figure 4A:
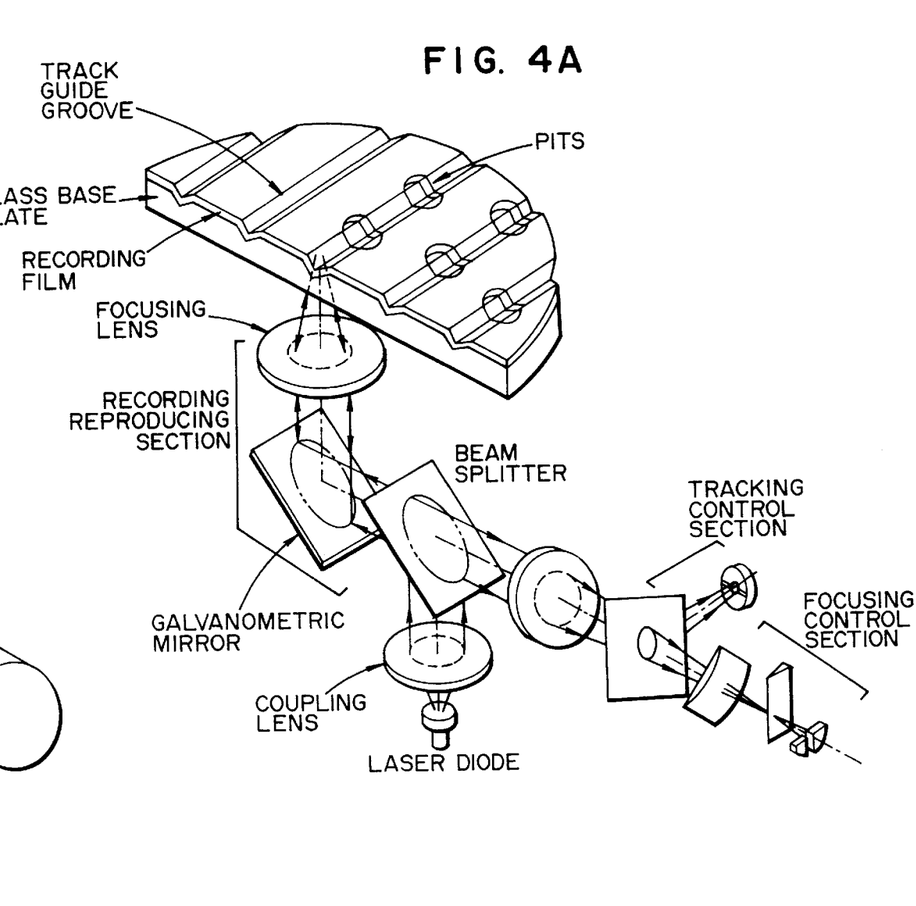
FIGS. 4A and 4B are schematic diagrams showing an example of the magneto-optical disk recording and reproducing apparatus to which the invention is applied.
Figure 4B:
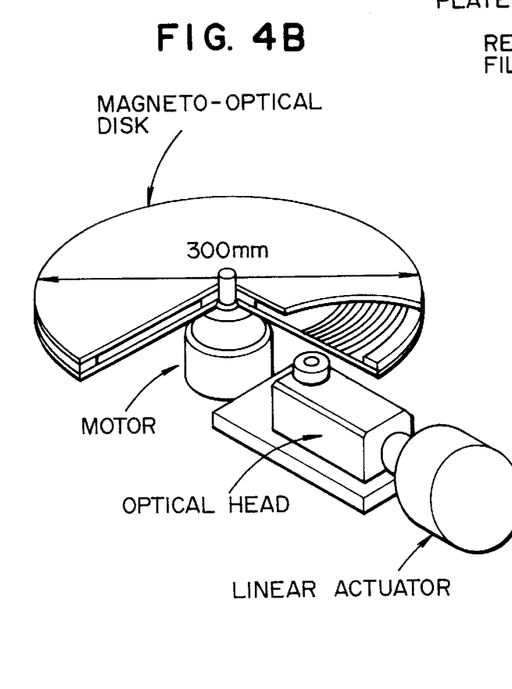

FIGS. 4A and 4B are schematic diagrams of an embodiment of the magneto-optical disk apparatus to which the invention is applied. As shown in FIG. 4B, an optical head is driven by a linear actuator and is accessed to a target information track at random. Although not particularly limited, the disk has a diameter of 30 cm. Since the diameter of the disk is relatively large, the relative moving speed of the laser beam spot will largely differ on the inner side tracks and the outer side tracks, and therefore, it is necessary to control the set widths of the currents IP and IW to values in a wide range in correspondence to such large relative moving speed values.

The disk may have what is called an air sandwich structure such that two base plates are stacked in a form in which a recording surface formed on the glass base plate is sealed therebetween. Track guide grooves are preliminarily formed on the recording surface of the disk as shown in FIG. 4A. A recording film is made by a Pb—Te—Se material and has a thickness of about 30 nm. The guide grooves have a spiral form and one circumference of the track is divided into 64 sectors. An address signal is previously formed at the head of each sector in a form of a pit, thereby enabling data to be retrieved on a sector unit basis.

The optical head includes a recording and reproducing section, a focusing signal control section, and a tracking signal control section. The recording or reproducing operation is performed by a single semiconductor laser (laser diode). Although not shown in the drawings, a coil for an auxiliary magnetic field is provided on an opposite side to the optical head. A temperature of the recording film is raised to a temperature near the Curie temperature by the semiconductor laser and a direction of a magnetic field is set by the auxiliary magnetic field, thereby writing or erasing a data. A driver according to an embodiment of the present invention supplies the laser diode with optimum currents IP and IW according to the input digital signals D1 and D2 generated by decoding the address signal as mentioned above, thereby performing the writing (erasing) operation. In the reading operation, the current IP or a current necessary to detect the direction of the magnetization which is smaller than the current IP is supplied to the laser diode LD.

Figure 5:
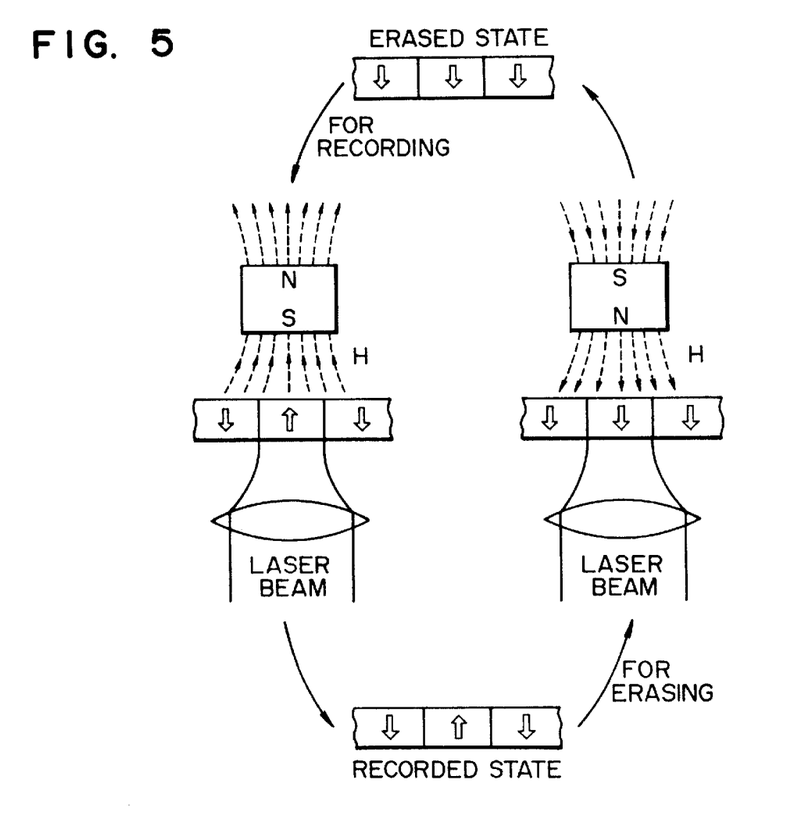
FIG. 5 is a principle diagram of the operation for explaining an example of the rewriting operation of the magneto-optical disk to which the invention is applied.

FIG. 5 is an operation principle diagram for explaining an operation of rewriting the magneto-optical disk to which the invention is applied. The temperature of the recording surface is raised to a temperature near the Curie temperature by radiation of the laser beam, and by applying a magnetic field H, for example, upward by the coil for the auxiliary magnetic field to the recording surface, the direction of the magnetization is reversed in a portion where the magnetic field is applied so that the recording surface is in a "recorded state". In the erasing operation, the temperature of the recording surface is raised to a temperature near the Curie temperature by radiation of the laser beam in a manner similar to the case of the writing operation, and by applying a magnetic field H downwardly by the coil for the auxiliary magnetic field, the recorded portion returns to the original state, so that magnetization is set to the same direction as in an "erased state".

The following operations and effects are obtained from the above embodiments.

(1) Since the drive currents with a good linearity can be produced in correspondence to the input digital signals generated on the basis of track information, the reliability and recording density of the magneto-optical disk apparatus can be improved.

(2) By supplying the collector current of the output transistor Q7 of the driver circuit DRV1 in the form of a pulse current produced by a gating operation of the current change-over switch of the differential transistors Q8' and Q9', the widths of magnetization patterns on the recording surface of the disk can be uniformed.

(3) The circuits DAC1, DAC2, LS1, LS2, DRV1, and DRV2 are implemented in a semiconductor integrated circuit apparatus, latch circuits are formed in input sections of the first and second D/A converter circuits DAC1 and DAC2, and the input digital signals are supplied to the latch circuits in a time-division fashion from a common input terminal, whereby the circuit structure can be simplified.

(4) The current suppressing sections C1 and C2 of the first and second driver circuits DRV1 and DRV2 are current-adjusted by the resistor elements R41 and R42 connected through the external terminals P1 and P3, the manufacturing processing variations of the level shifter circuits LS1 and LS2 and output transistors Q6 and Q7 can be easily compensated.

Although the invention has specifically been described above on the basis of preferred embodiments, the invention is not limited to the foregoing embodiments but many variations and modifications are possible within the scope of claims of the invention without departing from the spirit of the invention. For example, the collector current of the output transistor may be directly supplied to the laser diode LD. That is, the anode side of the laser diode LD is connected to the power source voltage VCC and a bias current source or a current that is driven by the driver is allowed to flow to the cathode side.

As a digital-analog converter circuit, any converter can be used so long as it can convert the digital signal to the analog voltage. Further, any level-shifter circuit may be used, provided that the analog input voltage, when all of the bits of the input digital signals are "0", is level-shifted for a good linearity of the output transistor for performing the voltage-current converting operation. Other structures may be employed for the current suppressing circuit for producing the same current as the collector current flowing in the output transistor responsive to the analog voltage at the "0" input digital signal and for supplying to the collector of the output transistor.

The present invention can be widely used as a laser diode driver for the light modulating type magneto-optical disk.

We claim:

1. An optical recording/reproducing apparatus having a laser diode and a semiconductor integrated circuit device for driving said laser diode, wherein said semiconductor integrated circuit device comprises:

a driver circuit responsive to an input signal for producing a drive current to be supplied to said laser diode, said driver circuit having a non-linear first operation range and a substantially linear second operation range subsequent to said first operation range;

a level shifter circuit connected to said driver circuit for applying a shift voltage to said driver circuit so that said driver circuit is set for said second operation range with a result that an excess output current is produced by said driver circuit for said input signal being nil; and a current suppressing circuit for supplying to said driver circuit a suppression current for preventing said excess current from being contained in said drive current from said driver circuit.

2. An optical recording/reproducing apparatus according to claim 1, further comprising an adjusting resistor connected to said current suppressing circuit for adjusting said suppression current.

3. An optical recording/reproducing apparatus according to claim 2, wherein said driver circuit, said level shifter circuit and said current suppressing circuit are implemented in a single semiconductor chip, with said adjusting resistor being externally connected to said driver circuit.

4. An optical recording/reproducing apparatus having a laser diode and a semiconductor integrated circuit device for driving said laser diode, wherein said semiconductor integrated circuit device comprises:

a digital-analog converter circuit for converting an input digital signal to an input analog signal, said input digital signal being representative of a laser beam power varying depending on a relative speed between a magneto-optical disk to be mounted on said apparatus and a spot of a laser beam emitted by the laser diode on the optical disk;

a level shifter circuit connected to receive said input analog signal, said level shifter circuit serving to generate a shift voltage and add said shift voltage to said input analog signal to generate a level-shifted input signal; and a driver circuit for producing a drive current to be supplied to said laser diode, said driver circuit including a drive current output section for producing said drive current having a non-linear first operation range and a substantially linear second operation range subsequent to said first operation range and connected to receive said level-shifted input signal with a result that an excess output current is produced from said drive current output section for said input digital signal being nil, said driver circuit further including a current suppressing section for supplying to said drive current output section a suppression current for preventing said excess current from being contained in said drive current from said drive current output section.

5. An optical recording/reproducing apparatus according to claim 4, wherein said driver circuit further includes an on-off controlled switching section for converting said drive current supplied from said drive current output section to a pulsating current.

6. An optical recording/reproducing apparatus according to claim 5, wherein said driver circuit further comprising an adjusting resistor connected to said current suppressing section for adjusting said suppression current, wherein said digital-analog converter circuit, said level shifter circuit and said driver circuit are implemented in a single semiconductor chip, with said adjusting resistor being externally connected to current suppressing section of said driver circuit.

7. An optical recording/reproducing apparatus according to claim 6, wherein:

said input digital signal contains a multi-bit first input digital signal portion responsible for a laser beam power component level necessary for a recording-reading operation of said apparatus and a multi-bit second input digital signal portion responsible for a laser beam power component level necessary for a preliminary heating of said disk;

the driver further comprises a first latch circuit for latching said multi-bit first input digital signal portion and a second latch circuit for latching said multi-bit second input digital signal portion, said first and second latch circuits having common input terminals for receiving said multi-bit first and second input digital signal portions in a time-division fashion;

said digital-analog converter circuit includes a first digital-analog converter circuit portion for converting said first input digital signal portion received from said first latch circuit to a first input analog signal portion, and a second digital-analog converter circuit portion for converting said second input digital signal portion received from said second latch circuit to a second input analog signal portion;

said level shifter circuit includes a first level shifter circuit portion connected to receive said first input analog signal portion, said first level shifter circuit portion serving to generate a first shift voltage and add said first shift voltage to said first input analog signal portion to generate a first level-shifted input signal portion, and a second level shifter circuit portion connected to receives said second input analog signal, said second level shifter circuit portion serving to generate a second shift voltage and add said second shift voltage to said second input analog signal portion to generate a second level-shifted input signal;

said driver circuit includes first and second driver circuit portions for producing first and second drive current portion to be supplied to said laser diode, respectively, said driver current containing said first drive current portion and said second drive current portion, said first driver circuit portion including a first drive current output section portion having a non-linear first operation range and a substantially linear second operation range subsequent to said first operation range and connected to receive said first level-shifted input signal portion with a result that a first excess output current is produced from said first drive current output section portion for said first input digital signal portion being nil, and said first driver circuit portion further including a first current suppressing section portion for supplying to said first drive current output section portion a first suppression current for preventing said first excess current from being contained in said first drive current portion from said first drive current output section portion, and said second driver circuit portion including a second drive current output section portion having a non-linear third operation range and a substantially linear fourth operation range subsequent to said third operation range and connected to receive said second level-shifted input signal portion with a result that a second excess output current is produced from said second drive current output section portion for said second digital signal portion being nil, and said second driver circuit portion further including a second current suppressing section portion for supplying to said second drive current output section portion a second suppression current for preventing said second excess current from being contained in said second drive current portion from said second drive current output section portion; and said on-off controlled switching section is provided in said first driver circuit portion for converting said first drive current portion supplied from said first drive current output section portion to said pulsating current.

\* \* \* \* \*